(12) United States Patent
Kahlman

(10) Patent No.: US 7,038,599 B2
(45) Date of Patent: May 2, 2006

(54) STOCHASTIC DC CONTROL

(75) Inventor: Josephus Arnoldus Henricus Maria Kahlman, Eindhoven (NL)

(73) Assignee: Koninklijke Philips Electronics N.V., Eindohoven (NL)

( * ) Notice: Subject to any disclaimer, the term of this patent is extended or adjusted under 35 U.S.C. 154(b) by 0 days.

(21) Appl. No.: 10/510,303

(22) PCT Filed: Apr. 10, 2003

(86) PCT No.: PCT/IB03/01460

§ 371 (c)(1),
(2), (4) Date: Oct. 6, 2004

(87) PCT Pub. No.: WO03/085667

PCT Pub. Date: Oct. 16, 2003

(65) Prior Publication Data

US 2005/0116842 A1    Jun. 2, 2005

(30) Foreign Application Priority Data

Apr. 11, 2002    (EP)    .................................. 02076424

(51) Int. Cl.
*H03M 5/00*    (2006.01)
(52) U.S. Cl. .............................. 341/58; 341/68; 341/69
(58) Field of Classification Search .................. 341/58, 341/68, 69, 55; 360/40; 375/292, 359
See application file for complete search history.

(56) References Cited

U.S. PATENT DOCUMENTS 3,902,117 A * 8/1975 Sheppard ..................... 375/292
4,343,023 A * 8/1982 Nishimura et al. ........... 360/40
4,369,516 A * 1/1983 Byrns ......................... 375/359
4,387,364 A * 6/1983 Shirota ........................ 341/55

FOREIGN PATENT DOCUMENTS

WO    WO 9900948    1/1999

* cited by examiner

*Primary Examiner*—Jean Bruner Jeanglaude
(74) *Attorney, Agent, or Firm*—Edward W. Goodman

(57) ABSTRACT

When recording data on a record carrier of the DC content of the data recorded is important in order to allow accurate reproduction of the data. The Digital Sum Value represents the DC content; the Digital Sum Value can be controlled by replacing code words at the output of an encoder by code words that can never occur during encoding. The replacement code word has different parity than the code word it replaces. The resulting stream of code words is subsequent encoded using an NRZI coder, so that the change in parity resulting from replacement code word results in a change of polarity of the NRZI output. The replacement code word can thus be used to change the polarity of the NRZI output to keep the Digital Sum Value low.

12 Claims, 6 Drawing Sheets

Table for use in encoder

| | | |
|---|---|---|
| 101 001 010 100 | → | 100 100 100 100 |
| 010 001 000 101 | → | 010 000 000 101 |
| 001 001 000 101 | → | 001 000 000 101 |
| 101 000 010 010 | → | 100 100 000 010 |
| 101 001 000 001 | → | 100 100 000 001 |
| 101 000 100 101 | → | 101 000 000 101 |
| 101 000 100 010 | → | 101 000 000 010 |

FIG. 6

Table for use in decoder

| | | |
|---|---|---|
| 100 100 100 100 | → | 101 001 010 100 |
| 010 000 000 101 | → | 010 001 000 101 |
| 001 000 000 101 | → | 001 001 000 101 |
| 100 100 000 010 | → | 101 000 010 010 |
| 100 100 000 001 | → | 101 001 000 001 |
| 101 000 000 101 | → | 101 000 100 101 |
| 101 000 000 010 | → | 101 000 100 010 |

FIG. 7

STOCHASTIC DC CONTROL

CROSS-REFERENCE TO RELATED APPLICATIONS

This application claims priority to International Patent Application No. PCT/IB031460, filed on Apr. 10, 2003, published as WO 03/085667 A1 on Oct. 16, 2003.

BACKGROUND OF THE INVENTION

The invention relates to a method for generating a channel code with DC control comprising the steps of:

converting a stream of P n-bit input words into a stream of P m-bit code words converting the stream of P m-bit code words into an output stream of P m-bit output words using a NRZI converter.

The invention further relates to a method of producing a record carrier on which a modulated signal obtained according to the previous method is recorded.

The invention also relates to a coding device for generating a channel code.

The invention further relates to a recording device in which such a coding device is used.

The invention still further relates to a signal comprising.

The invention further relates to a record carrier on which that signal is recorded.

The invention furthermore relates to a decoding device.

Finally, the invention relates to a reading device in which a record carrier of this type is used.

Such methods, such devices, such a record carrier and such a signal are known from PHQ98023/Wo99/00948.

When data is transmitted through a transmission line or recorded onto a recording medium such as a magnetic disc, an optical disc or a magneto-optic disc, the data is modulated into code matching the transmission line or the recording medium prior to the transmission or recording. As a technique of modulation, block encoding is known. In the block encoding, a data string is blocked into units each comprising m×i bits. Each of the units which is referred to hereafter as a data word is then converted into a code word comprising n×i bits in conformity with a proper coding rule. For i=1, this code word is a fixed length code. In the case of i having a plurality of values each selected from the range 1 to imax, a maximum of i, the resulting code word is a variable length code. In general, a code resulting from the block encoding is expressed as a variable length code (d, k; m, n; r).

Here, i is called a constraint length and r is imax, a maximum constraint length. d is the minimum number of 0s appearing between two consecutive 1s. d is referred to as a minimum run of 0s. On the other hand, k is the maximum number of 0s appearing between two consecutive 1s. k is referred to as a maximum run of 0s.

By the way, in an operation to record variable length code obtained from the block encoding described above onto a recording medium such as an optical disc or a magneto-optic disc, for example, on to a compact disc (CD) or a minidisc (MD), the variable length code undergoes an NRZI (Non Return to Zero Inverted) modulation wherein each "1" of the variable length code is interpreted as inversion while a "0" is interpreted as non-inversion The variable length code completing the NRZI modulation is then recorded. The variable length code completing the NRZI modulation is referred to as a recording wave train. In the case of a magneto-optic disc conforming to the early ISO specifications prescribing a not so large recording density, a train of bits completing recording modulation are recorded as they are without undergoing the NRZI modulation.

As described above, when data is transmitted through a transmission line or recorded onto a recording medium, the data is modulated into code matching the transmission line or the recording medium prior to the transmission or recording. If the code resulting from the modulation contains a direct current component, a variety of error signals such as tracking errors generated in control of a servo of the disc drive become prone to variations or jitters are generated easily. For this reason, it is thus desirable to make as many efforts to prevent the modulated code from containing a direct current component as possible.

In order to prevent the modulated code from containing a direct current component, control of a RDS (Running Digital Sum) to prevent the modulated code from containing a direct current component has been proposed. The RDS is a total found by adding up the values of a train of bits (symbols of data), wherein the values +1 and −1 are assigned to "1" and "0" in the train respectively, which results from NRZI modulation (that is, level encoding) of a train of channel bits. The RDS is an indicator of a direct current component contained in a train of codes. Decreasing the absolute value of the RDS through RDS control is equivalent to suppressing the magnitude of a direct current component contained in a train of codes.

RDS control is not applied to a modulation code generated in accordance with the variable length RLL (1–7) table shown as Table 1 given above. RDS control for such a case is accomplished by calculating a RDS of a train of encoded bits (a train of channel bits) after the modulation for a predetermined period of time and inserting a predetermined number of RDS control bits into the train of encoded bits (the train of channel bits).

At any rate, the RDS control bits are basically redundant bits. If the efficiency of the code conversion is to be taken into consideration, it is thus desirable to reduce the number of RDS control bits to a smallest possible value.

In addition, if RDS control bits are inserted, it is also desirable to make the minimum run d and the maximum run k unchanged. This is because a change in (d, k) will have an effect on recording/playback characteristics.

PHQ 98023 addresses the problems described above by allowing RDS control to be executed for producing high efficiency control bits.

Much like the conventional method, after a data string is converted by using a conversion table RDS control can be executed by adding RDS control bits at predetermined intervals to a train of channel bits resulting from the conversion. By making use of the relation between the data string and the string of code words resulting from conversion based on a conversion table, the RDS control can be executed.

Insertion of RDS control bits having a value of "1" to indicate inversion and a value of "0" to indicate non-inversion into a train of channel bits is equivalent to insertion of RDS control bits having a value of "1" to indicate inversion and a value of "0" to indicate non-inversion into a train of data bits.

Thus, inserting bits in the data string before the coder allows control of the RDS of the string of code words after the coder.

It is a disadvantage of this RDS control that in order to obtain better DC control more bits must be inserted in the data string, resulting in less recording capacity of the storage medium.

SUMMARY OF THE INVENTION

It is an object of the present invention to provide additional DC control without decreasing the recording capacity of the storage medium.

In order to obtain this objective the present invention is characterized in that the method comprises the following steps determining a running digital sum of the output stream of output words in response to the running digital sum replacing a sequence of Q m-bit code words, by a replacement sequence of Q m-bit replacement code words, the replacement sequence being equally long and having a different parity than the sequence of code words it replaces, and never occurring in a stream of m-bit code words when converting any stream of n-bit input words into m-bit code words.

This way DC control is achieved by replacing code words with equally long replacement code words whose different parity results in a change of the RDS, while not increasing the number of bits to be stored on the storage medium. By using replacement code words that do not normally occur when converting any stream of n-bit input words into m-bit code words the receiver can undo the replacement by substituting the replacement sequence of replacement code words by the original sequence of m-bit code words. When the replacement is effected using a table relating the code words to be replaced with replacement code words the same table can be used in an inverse way to relate the replacement code words to the code words that were replaced.

An embodiment of the method according to the invention is characterized in that Q is equal or larger than 4.

By selecting a unit of 4 m-bit words and operating on units of these 4 m-bit unit a balance is achieved between the frequency of occurance of replaceable code words in a stream and the availability of unused code words. If longer sequences are selected more unused code words will be available for use as replacement code words but the frequency of occurance of replaceable code words will decrease thus yielding less intstances were the replacement can, if desired occur. This means that if a correction of the DC level is desirable an opportunity to actually replace the sequence of control words will, on average, be delayed due to the reduced frequency of occurance of replaceable sequences. Further more high values of Q have a further disadvantage in that it causes unnecessary error propagation when decoding even if only 1 bit is defect.

A further embodiment is characterized in that a code constraint of the channel code is preserved.

By selecting the replacement code words such that the code constraints of the code are preserved the resulting output code words also comply with the constraints which is important in order to maintain the matching of the code to the channel characteristics.

A further embodiment is characterized in that a 17PP coder performs the conversion from n-bit input words into a stream of m-bit words.

The 17PP coder is specially adapted to recording on an optical recording medium, and exhibits sequences of code words that never occur when converting any stream of n-bit input words into m-bit code words making the code specially suitable for the present invention.

A further embodiment is characterized in that the replacement sequence is chosen from the following table:

| | | | |
|---|---|---|---|
| 1: 101 001 010 100 | -> | 100 100 100 100 |
| 2: 010 001 000 101 | -> | 010 000 000 101 |
| 3: 001 001 000 101 | -> | 001 000 000 101 |
| 4: 101 000 010 010 | -> | 100 100 000 010 |
| 5: 101 001 000 001 | -> | 100 100 000 001 |
| 6: 101 000 100 101 | -> | 101 000 000 101 |
| 7: 101 000 100 010 | -> | 101 000 000 010 |

The code words listed on the right hand side of the table never occur in the 17PP code and are thus suitable to replace the code words listen on the left hand side of the table.

Further more by using this replacement table the constraints of the code are preserved while the replacement code word comprise a different number of 'ones' such that the parity differs from the code word that is to be replaced.

Not all code words occur equally often when converting input words into code words.

The code words listed on the left hand side of the table are selected from all possible code words that never occur so that they frequently occur in streams of code words generated from input words by a 17PP coder. This way sufficient instances where the parity can be changed will occur in streams of code words.

The invention will now be dicussed based on the figures.

It should be kept in mind that although the discussion is based on a parity preserving 17PP coder, other coders can be employed as well. The inserted parity bits stem from the prior art and are included in the discussion only to indicate that the present invention can be combined with existing DC control. As an additional example a parity inverting coder could be used instead of the parity preserving coder. Because the present invention is in principle independent of the content of the stream of code words, except for the requirement that there must be code words that are never generated by the coder and thus never occur in the stream of code words, it is not limited to parity preserving coders and it is not required to already have DC control incorporated into the code stream. There are however advantages of using the present invention in combination with streams which already comprise DC control because the present invention adds another layer of DC control resulting in better DC control both when combining both DC controls ans when operating both DC controls independently.

BRIEF DESCRIPTION OF THE DRAWINGS

FIG. 6 shows a table used for selecting the replacement code words during data storage.

FIG. 7 shows the table for selecting the original code word based on the replacement code word during data retrieval.

DESCRIPTION OF THE PREFERRED EMBODIMENTS

Figure 1:
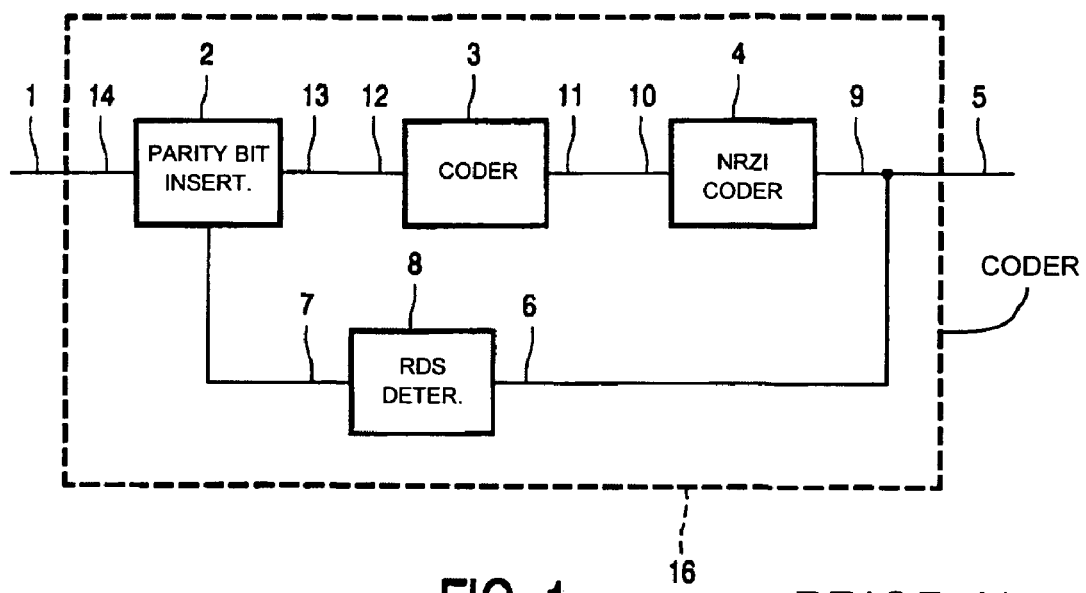
FIG. 1 shows the prior art where DC control is achieved by inserting parity control bits into the stream of input words.

In FIG. 1 a prior art system is shown where a stream of input words is presented to the input 1 of of the coder 16. From the input 1 the stream of input words is passed on to the input 14 of parity bit insertion means 2. Depending on data provided by the output 7 of the means for determining the running digital sum 8 to the running digital sum input 15 of the parity bit insertion means 2, the position of the parity bit and what kind of coder is used after the parity bit insertion means, the parity bit insertion means decides whether the inserted parity bit must have the value '1' or '0'. For this two calculations are performed, one calculation with an inserted parity bit with the value '0' and one calculation with an inserted parity bit value '1'. Depending on which outcome is favourable, i.e. resulting in the lowest absolute RDS value, one value for the inserted parity bit is choosen. The parity bit insertion means 2 provides via its output 13 the stream of input words with inserted parity bits to the input 12 of the coder 3, which could for instance be a 17PP coder as used in optical storage. The coder 3 codes the stream of input words with inserted parity bits into a stream of code words. The coder 3 provides this stream of code words via its output 11 to the input 10 of the NRZI coder 4. The NRZI coder 4 changes the format of the stream of code words into NRZI format and provides the stream of code words in NRZI format as the stream of output words to the output of the coder. NRZI coding effectively means that every '1' in the stream of code words results in a transition in the stream of output words.

Due to the parity preserving properties of the 17PP code the insertion of a parity bit with the value '1' in the stream of input words results in an additional transition in the stream of output words, effectively resulting in an inversion of the output words from this point onwards. The NRZI coder 4 provides the stream of output code words via its output 9 to the output 5 of the coder. The stream of output words is also provided to the input 6 of the running digital sum determining means 8, which continuously calculates the running digital sum of the stream of output code words.

Figure 2:
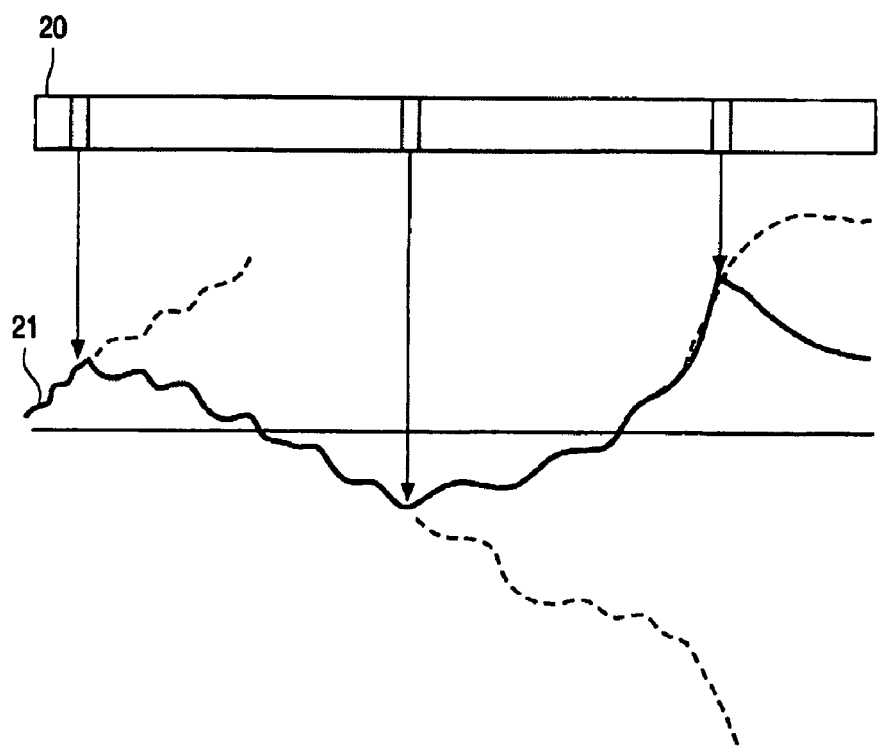
FIG. 2 shows the DC content of a signal and the control there of by inserting parity control bits.

In FIG. 2 the DC content of a stream of output code words is shown as produced by the coder of the prior art as explained in FIG. 1. In order to facilitate the explanantion other factors are being ignored, for instance the influence the position of the inserted parity bit has on the running digital sum.

The stream of input code words 20 comprises inserted parity bits 22, 23, 24, 25 which are inserted into the stream of input words at equal distances.

The Running Digital Sum (RDS) 21 of the stream of output words is equivalent to the DC content of the stream of output words. It is therefore desirable to maintain the RDS 21 of close to 0 as possible with the smallest possible deviations.

When a parity bit with the value '1' is inserted in the stream of input words, the RDS 21 of the stream of output words inverts its direction because the '1' results in an additional transition in the stream of output word because of the NRZI coding and the parity preservinf properties of the 17PP code. FIG. 2 indicates the correspondence between the inserted parity bits and the change of direction of the RDS 21. In order to determine the best value for the inserted parity bit two calculations are performed:

one with an inserted parity bit value of '0'
one with an inserted parity bit value of '1'.

The RDS is then determined for the next section of the stream of output words between the present position for the inserted parity bit and the position of the next inserted parity bit. One of the present parity bit causes the RDS to end as close as possible to an RDS of 0, and this optimal value of the parity bit will be inserted in the stream of input words as the inserted parity bit. Thus the parity bit insertion means looks ahead into the stream of input words to evaluate the consequence of a particular choice of the value of the inserted parity bit.

If the absolute value of the RDS at the next inserted parity bit position would end up being a larger value than the current value at the present inserted parity bit position the parity bit insertion means selects the value '1' for the parity bit that is to be inserted as the inserted parity bit, thus inverting the increase of the RDS caused by the next code words into a decrease of the RDS.

In FIG. 2 the value of the inserted parity bits 22, 23, is '1' causing the RDS 21 to move in the direction of 0. In the graph of the RDS 21 the dashed lines indicate the direction the RDS 21 would have taken if the inserted parity bit would not have had the value '1'.

In FIG. 2 the value of the inserted parity bit 24 is '0' because a choice of the value '1' would have caused the RDS 21 to move further away from 0.

Figure 3:
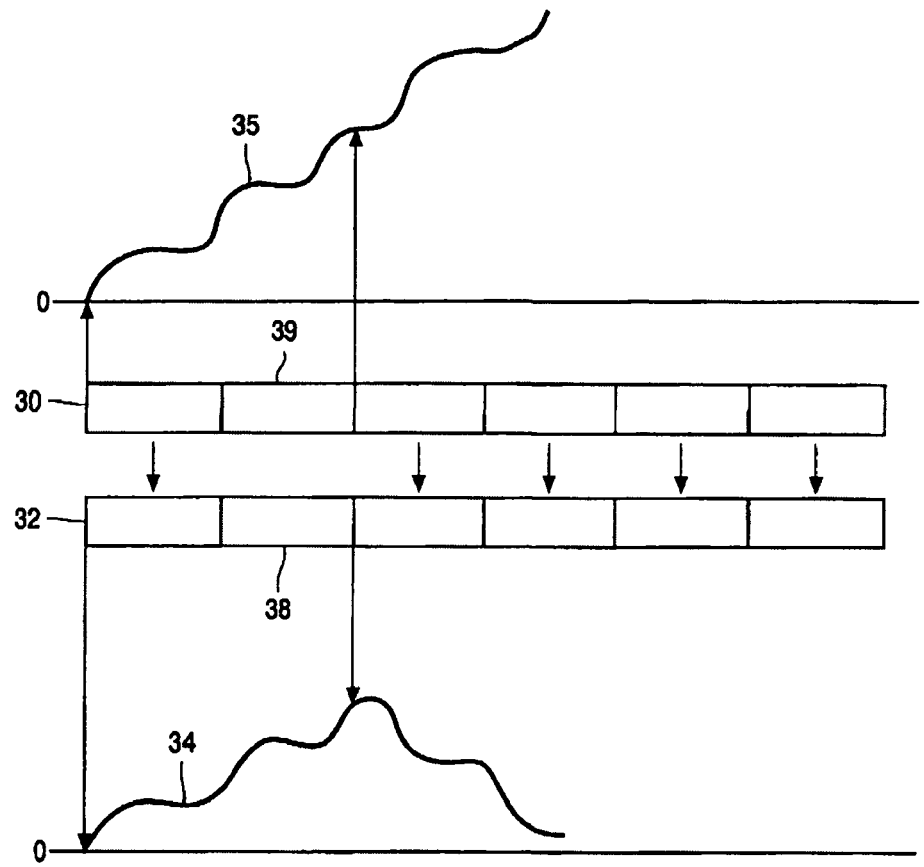
FIG. 3 shows the replacement of a code word with a replacement code word.

FIG. 3 shows in a simplified form the basic method of the present invention.

The stream of code words 30 as generated by a coder is evaluated to determine the start of each code word 38, 39. This is required in order to be able to match code words in the stream of code words with a set of code words that can potentially be replaced, i.e. replaceable code words. Once the boundaries of the code words are determined a sequence of code words is evaluated with a stepping window. In FIG. 3 a sequence of code words 39 is found which can be replaced by a sequence of replacement code words if desirable. Furthermore the RDS 35 of the stream of code words 30 and the RDS 34 of the stream of code words 32 comprising a sequence of replacement code words 38, from now on referred to as stream of processed code words, is shown. At the instant indicated by the arrows the RDS 35 moves further away from the target value 0. By replacing the sequence of code words 39 by the sequence of replacement code words 38 where the parity of the total sequence of replacement code words 38 differs from the parity of replaced sequence of code words 39, an inversion of the direction of the RDS 34 is effected. Because the sequence of replacement code words 38 never occurs in a normal stream of code words a decoder can detect this sequence of replacement code words 38 and substitute the original sequence of code words 38 when decoding the incoming stream of code words. Thus control of the RDS 34, 35 is obtained without increasing the overhead in the form of additional bits in the stream of code words 30.

Figure 4:
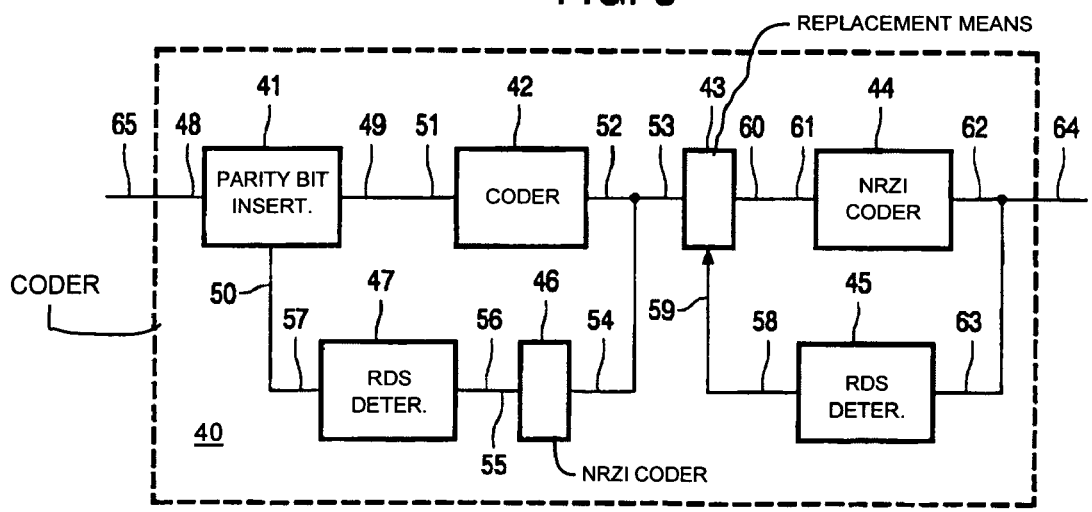
FIG. 4 shows the means for replacing a code word with a replacement code word.

FIG. 4 shows the encoder according to the present invention. A stream of input words is presented to the input 65 of the encoder 40. From the input 65 of the encoder 40 the stream of input words is presented to the input 48 of the parity bit insertion means 41. The parity bit insertion means functions exactly as explained in FIG. 1 and obtains its RDS value from the output 57 of the RDS determining means 47.

The RDS determining means 47 determine the running digital sum of the stream of words as present at the output of the NRZI coder 46. The Coder 42 obtains its input data from the output 49 of the parity bit insertion means 41 and provides, via its output 52 stream of code words to the input 54 of the NRZI coder and to input 53 of the replacement means 43. The replacement means 43 determines whether a sequence of code words must be replaced by a sequence of replacement code words in order to minimize the absolute value of the RDS obtained from the output 58 of the second RDS determining means 45. In order to determine whether to replace a sequence of code words or not two calculations of RDS are performed:

one with the original sequence of code words in the stream one with the sequence of replacement code words in the stream The RDS is determined from the current position up to the next occurance in the stream of a sequence of code words that can be replaced for both cases.

The case which results in the smallest absolute RDS value at the next occurance of a sequence of repleceable code words is then selected. The sequence of code words is then replaced by the sequence of replacement code words if this is the case where the absolute value of the RDS is minimized. Otherwise the original sequence of code words is left unreplaced in the stream.

The input 61 of the NRZI coder 44 is connected to the output 60 of the sequence of replacement code words replacement means 43 receives the processed stream of code words from the replacement means 43 in NRZI format to the ouput of the encoder 40 and the input of the RDS determining means 45.

Figure 5:
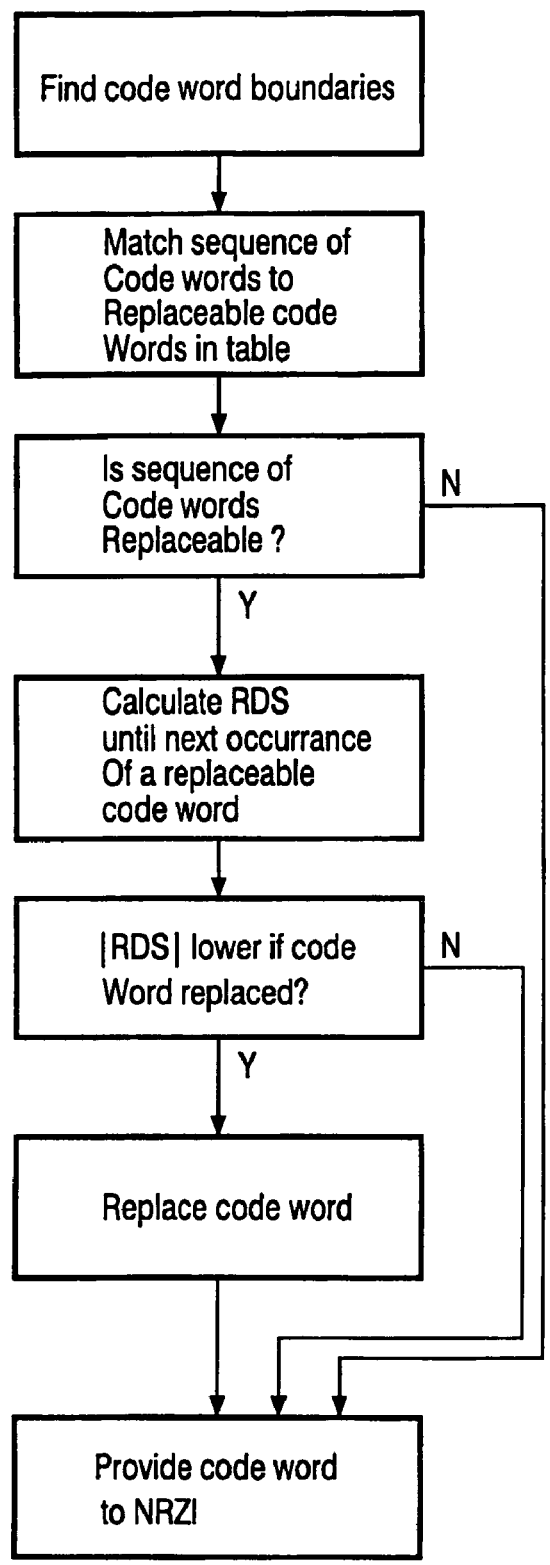
FIG. 5 shows the flow chart used for determining the possible replacement of a code word.

FIG. 5 shows the method for determining whether to replace a sequence of code words with a sequence of replacement code words. First a sequence of code words is obtained from a coder, for instance a 17PP coder. Next in order to be able to match a sequence of code words to sequences of code words that can be replaced the location of the boundaries of code words must be determined. Then each sequence of code words is evaluated to determine whether it matches a sequence of code words that can be replaced. If the sequence does not match a sequence of code words that can be replaced the sequence of code words is output to the NRZI coder. If the sequence of code words matches a sequence of code words that can be replaced, the RDS is determined for the stream of code words up to the next occurance of a sequence of replaceable code for both the situation in which the sequence of code words is replaced and the situation in which the sequence of code words is not replaced. If the absolute value of the RDS determined this way is lower if the sequence of code words is replaced the replacement in the stream is effected and the sequence of replacement code words is provided to the NRZI coder as part of the stream of processed code words, otherwise the sequence of code words is not replaced and provided to the NRZI coder for further processing.

FIG. 6 shows a look-up table for use by the encoder. The sequences of code words in the left column of the table are selected for frequent occurance in the 17PP code. Similar tables can of course be established for other codes. The corresponding sequences of replacement code words in the right column are selected on three criteria:

the sequences of replacement code words never occur when converting a stream of input words into a stream of code words.

the sequence of replacement code words has a different parity than the sequence of code words it replaces.

the code constraints are preserved

FIG. 7 shows the look-up table for use by the decoder. When the decoder encounters a sequence of code words that does normally never occur in the stream of code words it matches this sequence of code words to the code words in the left column of the table in FIG. 7. This sequence is then replaced by the corresponding sequence of code words in the right column of FIG. 7 in order to obtain a stream containing the original sequence of code words. This way the stream of code words as produced by the 17PP coder in the encoder is recreated by the encoder.

Figure 8:
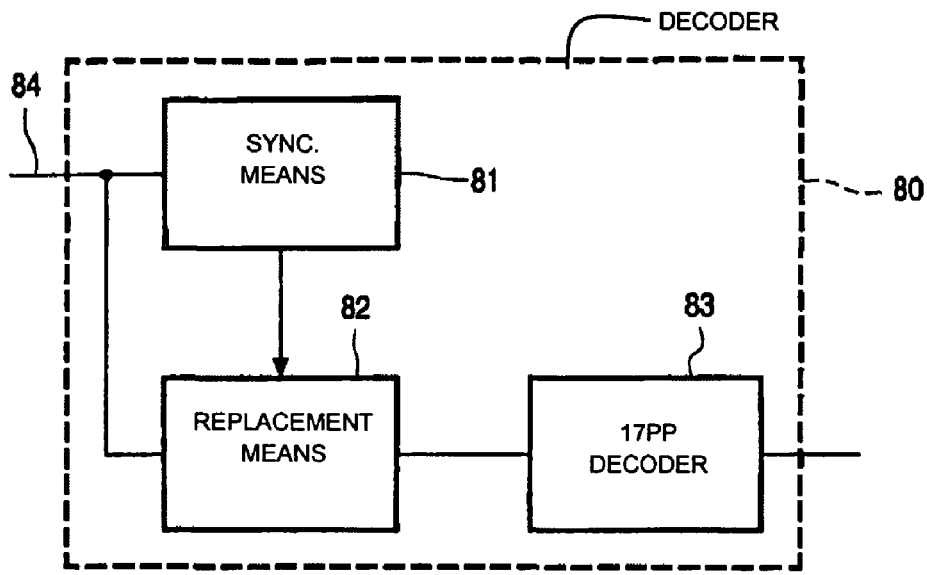
FIG. 8 shows the means for determining the original code word based on the replacement code word during data retrieval.

FIG. 8 shows the decoder. The decoder 80 comprises means 81 for synchronizing the replacement means 82 to the boundaries of the code words in the stream of code words. This is required in order to be able to match sequences of code words to sequences of code words in the left column of the table in FIG. 7. The sync information thus obtained is provided to the replacement means 82 by the means 81 for synchronization. The replacement means 82 receives the stream of code words from the input 84 of the decoder 80 and searches the stream for matches between sequences of code words in the stream of code words and entries of sequences of code words in the table of FIG. 7. When no match is found the sequence of code words is passed on to the 17PP decoder 83, while when a match is found the sequence of code words is replaced by the corresponding sequence of code words in the right column of the table of FIG. 7 before being sent to the 17PP decoder 83.

Figure 9:
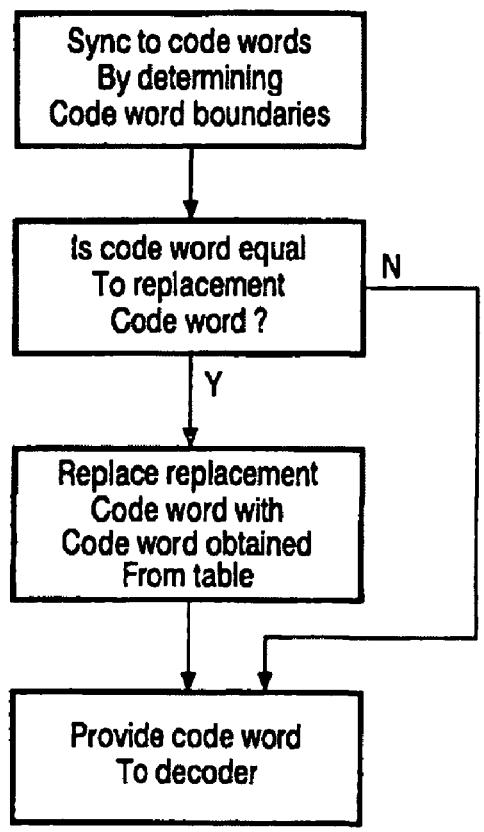
FIG. 9 shows the flow chart used for determining the correct code word during data retrieval.

FIG. 9 shows the steps the decoder takes to decode the stream of code words.

First the boundaries of the codewords are located by synchronizing to the stream of code words. Once the boundaries of the code words in the stream are established sequences of code words are compared to sequences of code words in the left column of table in FIG. 7.

When no match is found the sequence of code words is passed on to the 17PP decoder. If a match is found, the sequence of code words is replaced by the corresponding sequence of code words in the right column of table in FIG. 7 and sent to the 17PP decoder for further decoding. The 17PP decoder decodes the stream of code words, thus producing the original stream of input words as were presented to the input of the encoder.

Figure 10:
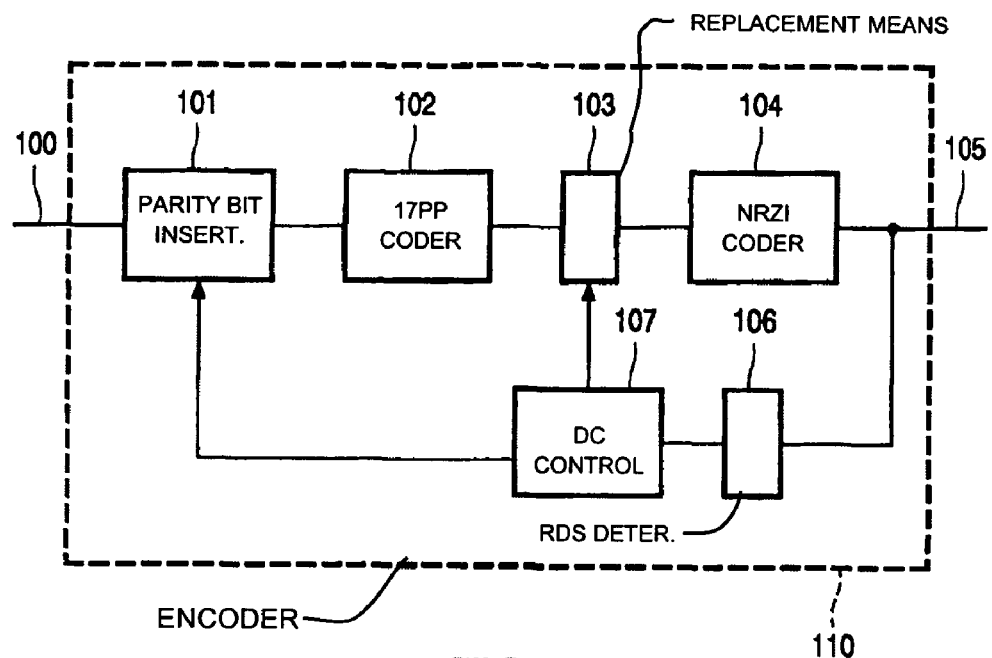
FIG. 10 shows a schematic block diagram of an encoder having DC control.

FIG. 10 shows a further improvement of the DC control by the encoder. Here the encoder 110 receives a stream of input words at the input 100 of the encoder 110. This stream of input words is provided to the parity bit insertion means 101 where a parity bit is inserted into the stream of input words depending on input provided by the DC control means 107. The stream of input words now comprising the inserted parity bits is provided by the parity bit insertion means 101 to the 17PP coder 102 where the stream of input words comprising the inserted parity bits is encoded into a stream of code words according to the 17PP code. This stream of code words is then provided by the 17PP coder 102 to the replacement means 103 where, depending on information provided by the DC control means 107, a sequence of code words is replaced, or not, as described in FIGS. 4 and 5 thus resulting in a sequence of processed code words. This sequence of processed code words is then provided by the replacement means 103 to the NRZI coder 104 where the format of the stream of processed code words is coded into a stream of processed code words in the NRZI format. The NRZI coder 104 provides this stream of processed code words in the NRZI format as a stream of output words to the output 105 of the encoder 110 and to the RDS determining means 106. The RDS determining means forms the running digital sum value of the stream of processed code words in the NRZI format and provides this running digital sum value to the DC control means 107 thus effectively closing a feedback loop. Because the DC control means now controls both the parity bit insertion means 101 and the replacement means 103 more degrees of freedom for determining the optimal value of the inserted parity bit and whether to replace a sequence of code words is obtained resulting in a more effective control of the DC content of the stream of output words.

Compared to FIG. 4 where the decision to replace a code word was taken by the replacement means 43, in FIG. 10 the decision is taken by the DC control means 107 because considerations have to be given to the effects of both the parity insertion means 101 and the replacement means 103 while in FIG. 4 replacement means 43 has no control of the parity insertion means 41.

It has to be noted that the choice of value of the inserted parity bit influences the necessity of replacement of a stream of code words and vice versa. In addition to this the positions of the inserted parity bits and the position of the sequences of code words that can be replaced as occuring in the stream influence the decisions whether to employ the inserted parity bit or to employ the sequence of replaced code words or to employ them both for optimal DC control.

Figure 11:
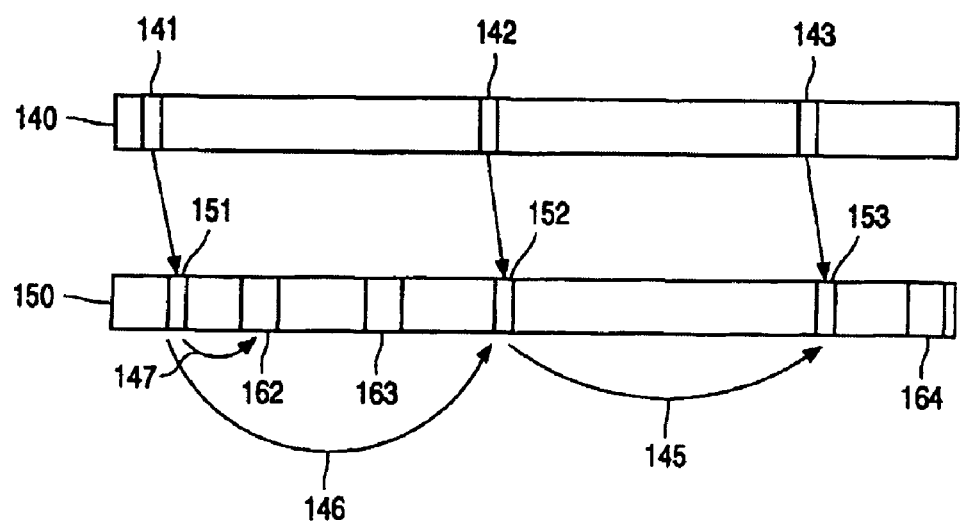
FIG. 11 shows a stream of code words with replacement code words.

FIG. 11 shows an example of a stream of code words and indicates positions where the inserted parity bits in the stream of input words starts to affect the stream of code words and positions of replaceable code words. It must be noted however that in an actual stream of code words as generated by a 17PP coder the position of the inserted parity bits can only be indicated approximately due to the effect of the coding as is indicated in FIG. 11 for the inserted parity bits 141, 142, 143 in the stream 140 of input words by indicating a corresponding position 151, 152, 153 where the inserted parity bits 141, 142, 143 start having an effect in the stream of code words 150. The position of replaceable code words 161, 162, 163 in the stream of code words 150 is also indicated.

When applying DC control using both the inserted parity bits 141, 142, 143 and the replaceable code words 161, 162, 163 the coder must decide:

when to exercise DC control, i.e. whether to use a particular parity bit or replaceable code word for this purpose how far to look ahead when deciding whether to, use a particular parity bit or replaceable code word for DC control with the options:

from the inserted parity bit 151 to the next inserted parity bit 152

From the inserted parity bit 151 to the next replaceable code word 162

From the replaceable code word 162 to the next replaceable code word 163

From replaceable code word 162 to the next inserted parity bit 152

Single reference to the designators in FIG. 11 are being used in order to maintain clarity of the description.

The choice of these options influences the effectiveness of the DC control and is strongly related to the choice of coder, distance between inserted parity bits 141, 142, 143 and statistical distribution of the distances between two successive replaceable code words 162, 163, 164 as choosen.

It is further clear that the decision on how far to look ahead is not limited to looking ahead to the next inserted parity bit or replaceable code word. Inserted parities and replaceable code words are DC control opportunities. For instance when deciding on the value of an inserted parity bit, looking further ahead than the next DC control opportunity means that at least one DC control opportunity is comprised in the calculations of the RDS. If no DC control opportunity is comprised in the calculations of RDS the DC control means only needs to determine the RDS once for the case the inserted parity bit has the value '0' and once for the case the inserted parity bit has the value '1'. This is for instance the case between the second inserted parity bit 142 and the third inserted parity bit 143 in FIG. 11 where the look ahead is indicated by the arrow 145.

If a DC control opportunity is included part of the stream used in the calculation of the RDS the calculations must include the case where the DC control opportunity is used for DC control and the case where the DC control opportunity is not used for DC control, effectively doubling the number of calculations but also increasing the level of DC control above the level of DC control obtained by using inserted parity bits and replaceable code words independently of each other or by looking less far ahead.

This is for instance the case between the first inserted parity bit 141 and the second inserted parity bit 142 where even two DC control opportunities are located between the inserted parities, resulting quadrupeling the number of RDS scenarios to be calculate in order to decide on the proper value of the first inserted parity bit 141. This looka ahead is indicated in FIG. 11 by the arrow 146.

Looking only as far ahead as the next DC control opportunity allows the calculation of the RDS to be reduced, resulting in a reduced complexity of the DC control means.

This is for instance the case between the first inserted parity 141 and the first replaceable code word 162. This look ahead is indicated in FIG. 11 by the arrow 147.

The invention claimed is:

1. A method for generating a channel code with DC control, said method comprising the steps of:

converting a stream of P n-bit input words into a stream of P m-bit code words; and converting the stream of P m-bit code words into an output stream of P m-bit output words using a NRZI converter, characterized in that the method further comprises the steps of:

determining a running digital sum of the output stream of output words; and in response to the running digital sum, replacing a sequence of Q m-bit code words, by a replacement sequence of Q m-bit replacement code words, the replacement sequence being equally long and having a different parity than the sequence of code words being replaced, and said replacement sequence never occurring in a stream of m-bit code words when converting any stream of n-bit input words into m-bit code words, and in that the replacement sequence is chosen from the following table:

| 1: | 101 001 010 100 −> 100 100 100 100 |
|---|---|
| 2: | 010 001 000 101 −> 010 000 000 101 |
| 3: | 001 001 000 101 −> 001 000 000 101 |
| 4: | 101 000 010 010 −> 100 100 000 010 |
| 5: | 101 001 000 001 −> 100 100 000 001 |
| 6: | 101 000 100 101 −> 101 000 000 101 |
| 7: | 101 000 100 010 −> 101 000 000 010. |

2. The method as claimed in claim 1, characterized in that the method is employed after a further method of DC control.

3. The method as claimed in claim 2, characterized in that each method determines the running digital sum taking into consideration effects of the other method in the running digital sum.

4. The method as claimed in claim 1, characterized in that converting a stream of P n-bit words into a stream of P m-bit code words is achieved with a parity preserving coder.

5. The method as claimed in claim 4, characterized in that a 17PP coder performs the conversion from n-bit input words into a stream of m-bit words.

6. The method as claimed in claim 1, characterized in that Q is equal to or larger than 4.

7. The method as claimed in claim 1, characterized in that a code constraint of the channel code is preserved.

8. A coding device using the method as claimed in claim 1.

9. A recording device comprising the coding device as claimed in claim 8.

10. A signal comprising a stream of code word obtained using the method as claimed in claim 1.

11. A record carrier comprising the signal as claimed in claim 1.

12. a reading device for reading the record carrier as claimed in claim 11.

* * * * *